United States Patent
Kim

(10) Patent No.: US 10,330,738 B2
(45) Date of Patent: Jun. 25, 2019

(54) APPARATUS FOR ESTIMATING BATTERY DEGRADATION STATE, SYSTEM INCLUDING THE SAME, AND METHOD THEREOF

(71) Applicants: HYUNDAI MOTOR COMPANY, Seoul (KR); KIA MOTORS CORPORATION, Seoul (KR)

(72) Inventor: Woo Sung Kim, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 69 days.

(21) Appl. No.: 15/652,830

(22) Filed: Jul. 18, 2017

(65) Prior Publication Data

US 2018/0299511 A1     Oct. 18, 2018

(30) Foreign Application Priority Data

Apr. 18, 2017     (KR) .................. 10-2017-0049818

(51) Int. Cl.

| | |
|---|---|
| G01R 31/392 | (2019.01) |
| G01R 31/367 | (2019.01) |
| G01R 31/371 | (2019.01) |
| G01R 31/3832 | (2019.01) |
| G01R 31/3835 | (2019.01) |
| B60L 58/16 | (2019.01) |

(52) U.S. Cl.
CPC ......... *G01R 31/392* (2019.01); *G01R 31/367* (2019.01); *G01R 31/371* (2019.01); *G01R 31/3832* (2019.01); *G01R 31/3835* (2019.01); *B60L 58/16* (2019.02)

(58) Field of Classification Search
CPC .......................... G01R 31/3679; G01R 31/392
USPC ........................................................... 702/63
See application file for complete search history.

(56) References Cited

U.S. PATENT DOCUMENTS

| | | | |
|---|---|---|---|
| 7,622,894 B2 | 11/2009 | Kawahara et al. | |
| 8,054,045 B2 | 11/2011 | Kawahara et al. | |
| 9,525,300 B2 | 12/2016 | Aridome | |
| 2004/0178798 A1* | 9/2004 | Kikuchi ........... | G01R 19/16542 324/426 |
| 2006/0202857 A1 | 9/2006 | Kawahara et al. | |

(Continued)

FOREIGN PATENT DOCUMENTS

| | | |
|---|---|---|
| JP | 2006-242880 A | 9/2006 |
| JP | 2014-138525 A | 7/2014 |
| KR | 10-2016-0062468 A | 6/2016 |

*Primary Examiner* — Hien D Khuu
(74) *Attorney, Agent, or Firm* — Morgan, Lewis & Bockius LLP

(57) ABSTRACT

An apparatus for estimating a battery degradation state, a system including the same, and a method thereof are provided. The battery degradation state estimation system includes a battery degradation state estimation apparatus, implemented by a processor, that estimates a battery degradation state by using a correction coefficient calculated from a difference between a first open circuit voltage (OCV), calculated from battery state information, and a second open circuit voltage (OCV_i), acquired based on a change amount of a battery state of charge (SoC) determined by current integration, and a memory device that stores the first open circuit voltage (OCV), the second open circuit voltage (OCV_i), and the correction coefficient.

16 Claims, 10 Drawing Sheets

(56) References Cited

U.S. PATENT DOCUMENTS

| | | |
|---|---|---|
| 2010/0030499 A1 | 2/2010 | Kawahara et al. |
| 2011/0084702 A1 | 4/2011 | Mori |
| 2014/0095060 A1* | 4/2014 | Heo .................. B60L 11/1861 |
| | | 701/123 |
| 2015/0236525 A1 | 8/2015 | Aridome |
| 2015/0369873 A1* | 12/2015 | Nakao ................ G01R 31/3606 |
| | | 702/63 |
| 2015/0377974 A1* | 12/2015 | Choi .................... G01R 31/367 |
| | | 702/63 |
| 2016/0363630 A1* | 12/2016 | Laskowsky .......... G01R 31/367 |
| 2017/0176540 A1* | 6/2017 | Omi ...................... H01M 10/48 |
| 2017/0242079 A1* | 8/2017 | Duan ................. G01R 31/3648 |

\* cited by examiner

APPARATUS FOR ESTIMATING BATTERY DEGRADATION STATE, SYSTEM INCLUDING THE SAME, AND METHOD THEREOF

CROSS-REFERENCE TO RELATED APPLICATION

The present application is based on and claims the benefit of priority to Korean Patent Application No. 10-2017-0049818, filed on Apr. 18, 2017, with the Korean Intellectual Property Office, the entire disclosure of which is incorporated herein by reference.

TECHNICAL FIELD

The present disclosure relates to an apparatus for estimating a battery degradation state, a system including the same, and a method thereof, and more particularly, to a technology for predicting a battery degradation state using characteristics of change in correction coefficient according to change in open circuit voltage (OCV).

BACKGROUND

Vehicles such as a hybrid electric vehicle (HEV), a plug in hybrid electric vehicle (PHEV), and an electric vehicle (EV) are driven using a battery and, since a battery state of charge (SoC) is directly related to a driving distance, it is necessary to accurately detect a battery degradation degree.

However, according to a conventional method of detecting the degradation degree, the degradation degree is estimated only in a constant current condition (charging condition). Accordingly, it is difficult to estimate a battery degradation degree of a hybrid electric vehicle (HEV) that does not perform charging. It is possible to estimate the battery degradation degree for a plug in hybrid electric vehicle (PHEV) and an electric vehicle (EV), which perform charging.

In addition, there is a limitation in that a degradation degree is capable of being detected in a predetermined condition such as an initial state of charge (SoC) condition, a temperature condition, and a charging time in order to enhance accuracy of detecting a degradation degree in a constant current condition.

In addition, it may be impossible to calculate a degradation degree depending on an actual environment in which a vehicle is used and, thus, there is a problem in that the validity of calculation logic of a degradation degree is very low.

SUMMARY

The present disclosure has been made to solve the above-mentioned problems occurring in the prior art while advantages achieved by the prior art are maintained intact.

An aspect of the present disclosure provides an apparatus for estimating a battery degradation state, a system including the same, and a method thereof, for predicting battery degradation in real time by predicting a battery degradation state using characteristics of change in correction coefficient according to change in open circuit voltage OCV to estimate a battery degradation state anytime irrespective of a vehicle type.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, a system for estimating a battery degradation state may include a battery degradation state estimation apparatus, implemented by a processor, that estimates a battery degradation state by using a correction coefficient calculated from a difference between a first open circuit voltage (OCV), calculated from battery state information, and a second open circuit voltage (OCV_i), acquired based on a change amount of a battery state of charge (SoC), determined by current integration, and a memory device that stores the first open circuit voltage, the second open circuit voltage, and the correction coefficient.

According to an embodiment, the battery state information may include voltage, temperature, and current.

According to an embodiment, the battery degradation state estimation apparatus may include a first open circuit voltage calculation unit that calculates the first open circuit voltage by using the battery state information and a battery equivalent model, an integration unit that calculates a change amount of a battery state of charge (SoC) by integrating current of a battery, a second open circuit voltage calculation unit that calculates the second open circuit voltage corresponding to the change amount of the battery SoC by using a mapping table, a correction coefficient calculation unit that calculates the correction coefficient by using a difference between the first open circuit voltage and the second open circuit voltage, and a degradation degree estimation unit that estimates a battery degradation degree by using the correction coefficient.

According to an embodiment, the battery degradation state estimation apparatus may further include a measurement unit that measures the battery state information.

According to an embodiment, the first open circuit voltage calculation unit may be configured to measure a terminal voltage of the battery equivalent model and subtract a voltage across an internal resistor and a phantom voltage component from the measured terminal voltage to calculate the first open circuit voltage.

According to an embodiment, the second open circuit voltage calculation unit may be configured to calculate an open circuit voltage mapped to the change amount of the battery SoC and determined the calculated open circuit voltage as the second open circuit voltage by using the mapping table formed by mapping the open circuit voltage and the battery SoC.

According to an embodiment, the battery degradation state estimation apparatus may further include a degradation degree calculating condition determination unit that determines an open circuit voltage calculating condition and perform correction coefficient matching for calculation of the first open circuit voltage and the second open circuit voltage.

According to an embodiment, the degradation degree calculating condition determination unit may be configured to determine whether the open circuit voltage calculating condition is satisfied according to current and voltage distribution degrees of the battery.

According to an embodiment, the degradation degree calculating condition determination unit may assume an initial voltage measured when a vehicle starts as an open circuit voltage and calculate the battery SoC depending on the assumed open circuit voltage, and when a deviation between a current battery SoC and the battery SoC calculated based on the initial voltage exceeds a predetermined range, the degradation degree calculating condition determination unit may determine that the correction coefficient matching is not satisfied.

According to an embodiment, the system may further include a display device that displays a driving distance according to the estimated battery degradation state and the estimated degradation degree.

According to another aspect of the present disclosure, a battery degradation state estimation apparatus, implemented by a processor, may include a measurement unit that measures battery state information, a first open circuit voltage calculation unit that calculates a first open circuit voltage by using the measured battery state information and a battery equivalent model, an integration unit that calculates a change amount of a battery state of charge (SoC) by integrating current of a battery, a second open circuit voltage calculation unit that calculates a second open circuit voltage corresponding to the change amount of the battery state of charge (SoC), a correction coefficient calculation unit that calculates a correction coefficient by using a difference of the first open circuit voltage and the second open circuit voltage, and a degradation degree estimation unit that estimates a battery degradation degree by using the correction coefficient.

According to an embodiment, the first open circuit voltage calculation unit may be configured to measure a terminal voltage of the battery equivalent model and subtract a voltage across an internal resistor and a phantom voltage component from the measured terminal voltage to calculate the first open circuit voltage.

According to an embodiment, the second open circuit voltage calculation unit may be configured to calculate an open circuit voltage mapped to the change amount of the battery SoC and determine the calculated open circuit voltage as the second open circuit voltage by using a mapping table configured to map the open circuit voltage and the battery SoC.

According to an embodiment, the apparatus may further include a degradation degree calculating condition determination unit that determines an open circuit voltage calculating condition and perform correction coefficient matching for calculation of the first open circuit voltage and the second open circuit voltage.

According to an embodiment, the first open circuit voltage calculation unit and the second open circuit voltage calculation unit may be configured to calculate the first open circuit voltage and the second open circuit voltage when the open circuit voltage calculating condition and the correction coefficient matching are satisfied.

According to another aspect of the present disclosure, a method of estimating a battery degradation state includes measuring battery state information, calculating a first open circuit voltage using the measured battery state information and a battery equivalent model, calculating a change amount of a battery state of charge (SoC) by integrating current of a battery, calculating a second open circuit voltage corresponding to the change amount of the battery SoC using a mapping table, calculating a correction coefficient using a difference between the first open circuit voltage and the second open circuit voltage, and estimating a battery degradation degree using the correction coefficient.

According to an embodiment, the method may further include, prior to the calculating of a first open circuit voltage, determining an open circuit voltage calculating condition and correction coefficient matching for calculation of the first open circuit voltage and the second open circuit voltage.

According to an embodiment, the calculating of a first open circuit voltage may include measuring a terminal voltage of the battery equivalent model and subtracting a voltage across an internal resistor and a phantom voltage component from the measured terminal voltage to calculate the first open circuit voltage.

According to an embodiment, the calculating of a second open circuit voltage may include calculating an open circuit voltage mapped to the change amount of the battery SoC and determining the calculated open circuit voltage as the second open circuit voltage by using the mapping table configured to map the open circuit voltage and the battery SoC.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
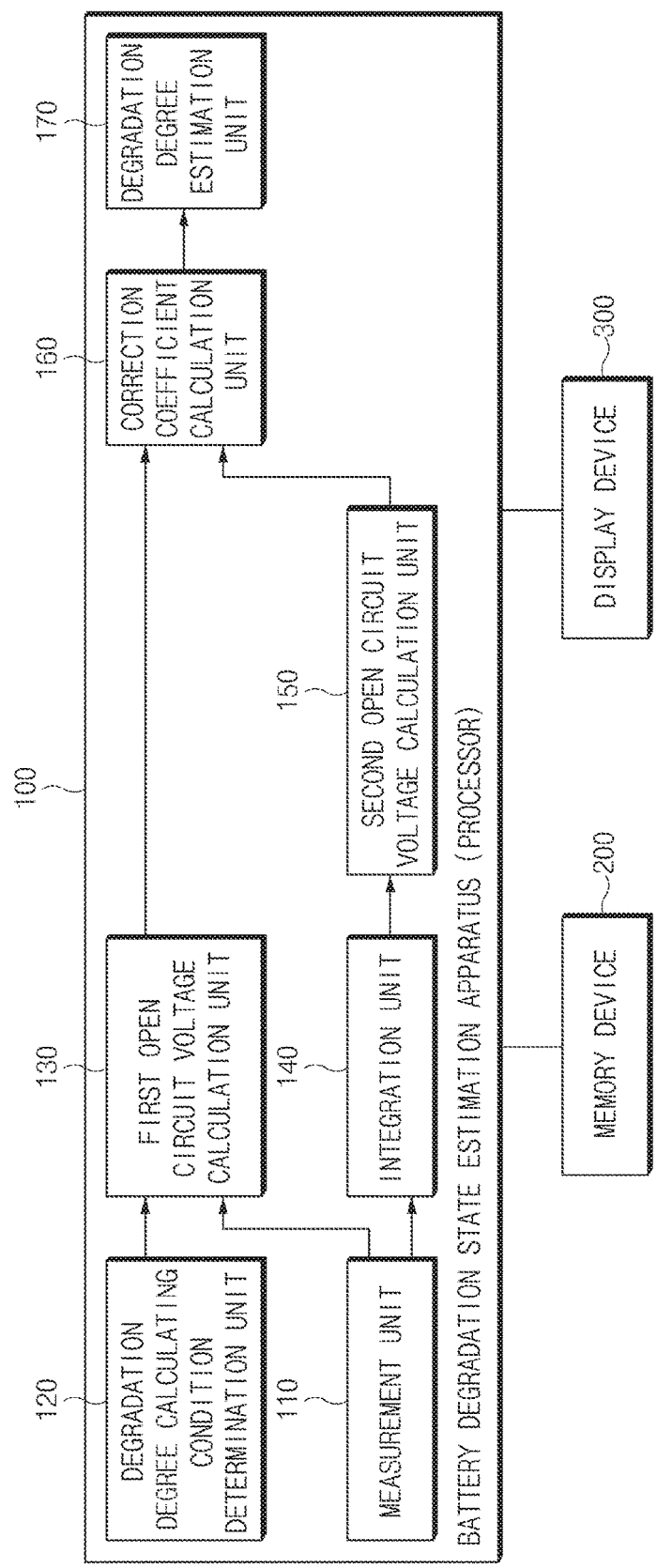
FIG. 1 is a diagram of a configuration of a system for estimating a battery degradation state according to an embodiment of the present disclosure.

Hereinafter, embodiments of the present disclosure will be described in detail with reference to the accompanying drawings. In the drawings, the same reference numerals will be assigned to the same elements even though the elements are shown in different drawings. In addition, in the following description, a detailed description of well-known features or functions will be ruled out in order not to unnecessarily obscure the gist of the present disclosure.

In the following description of elements according to an embodiment of the present disclosure, the terms 'first', 'second', 'A', 'B', '(a)', and '(b)' may be used. The terms are used only to distinguish relevant elements from other elements, and the nature, the order, or the sequence of the relevant elements is not limited to the terms. In addition, unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

According to the present disclosure, a hybrid electric vehicle (HEV), a plug in hybrid electric vehicle (PHEV), and an electric vehicle (EV), which are not required to be separately charged, are driven using a battery and, thus, it is important to estimate battery degradation. The present disclosure discloses a technology for estimating battery degradation anytime irrespective of a vehicle type using a change rate of a correction coefficient via calculation of an open circuit voltage OCV.

Hereinafter, embodiments of the present disclosure will be described in detail with reference to FIGS. 1 to 9.

FIG. 1 is a diagram of a configuration of a system for estimating a battery degradation state according to an embodiment of the present disclosure.

Referring to FIG. 1, the system for estimating a battery degradation state according to an embodiment of the present disclosure may include a battery degradation state estimation apparatus 100, a memory device 200, and a display device 300.

The battery degradation state estimation apparatus 100 may estimate a battery degradation state using a correction coefficient that is a difference value between a first open circuit voltage OCV calculated using measured battery state information and a second open circuit voltage OCV_i mapped to a change amount of a battery state of charging (SoC), which is determined through current integration from a mapping table. In this case, the battery state information may include voltage, temperature, and current.

The battery degradation state estimation apparatus 100, implemented by a processor, performs various functions of following units 110, 120, 130, 140, 150, 160 and 170. The units 110, 120, 130, 140, 150, 160 and 170 described below are implemented with software instructions executed on the processor.

To this end, the battery degradation state estimation apparatus 100 may include a measurement unit 110, a degradation degree calculating condition determination unit 120, a first open circuit voltage calculation unit 130, an integration unit 140, a second open circuit voltage calculation unit 150, a correction coefficient calculation unit 160, and a degradation degree estimation unit 170.

The measurement unit 110 may measure current, voltage, and temperature of a high-voltage battery of a vehicle.

The degradation degree calculating condition determination unit 120 may determine correction coefficient matching and an open circuit voltage calculating condition for calculation of the first open circuit voltage and the second open circuit voltage. That is, the degradation degree calculating condition determination unit 120 may determine whether a degradation degree calculating condition is satisfied by determining whether the open circuit voltage calculating condition is satisfied, whether correction coefficient matching is satisfied, and so on.

In this case, the degradation degree calculating condition determination unit 120 may determine whether the open circuit voltage calculating condition is satisfied depending on a battery current and voltage distribution degree. That is, when current and voltage distribution is wide, it may be possible to calculate slope and, accordingly, the open circuit voltage calculating condition may be satisfied.

In addition, the degradation degree calculating condition determination unit 120 may assume an initial voltage measured at a time point when a vehicle starts as an open circuit voltage and calculate a battery SoC based on the assumed open circuit voltage. When a deviation between a current battery SoC and the battery SoC calculated based on the initial voltage exceeds a predetermined range, the degradation degree calculating condition determination unit 120 may determine that correction coefficient matching is not satisfied.

Figure 2:
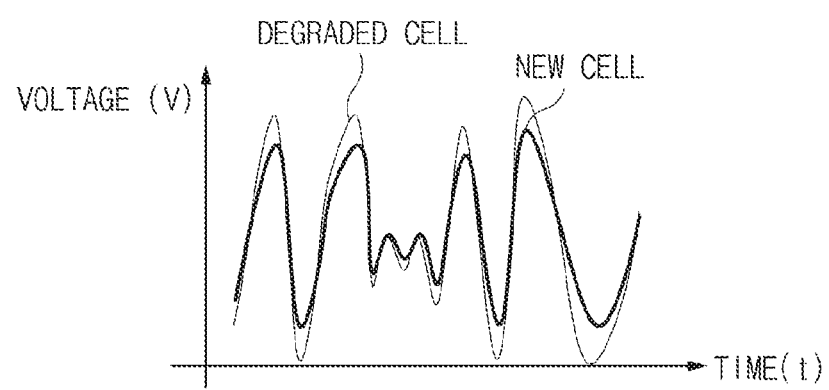
FIG. 2 is a graph showing a voltage change state of a degraded cell of a battery according to an embodiment of the present disclosure.

FIG. 2 is a graph showing a voltage change state of a degraded cell of a battery according to an embodiment of the present disclosure. As seen from FIG. 2, as a battery is further degraded, a voltage change amount is increased.

Figure 3A:
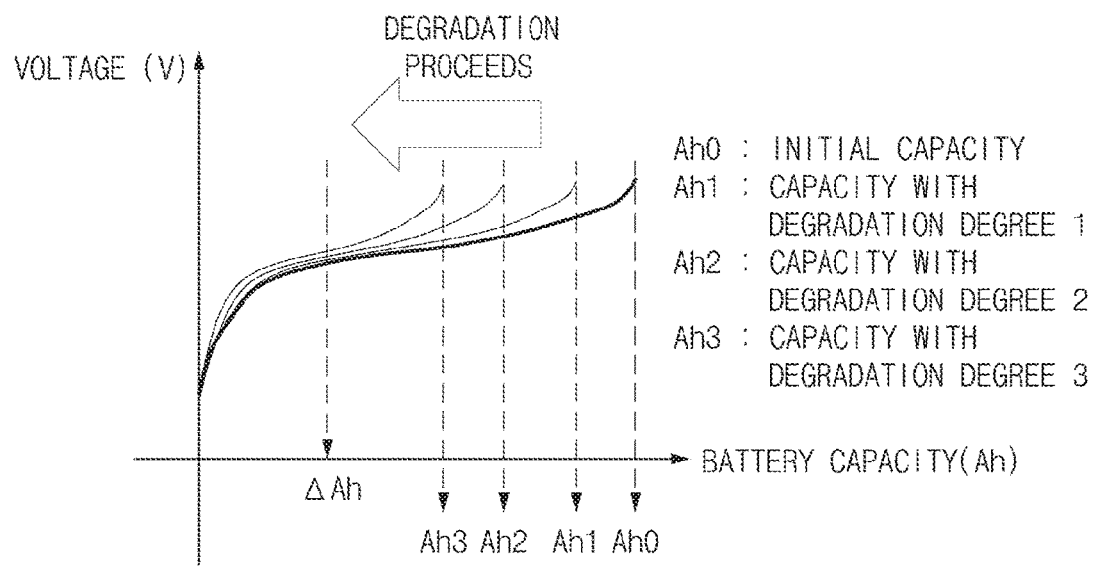
FIG. 3A is a graph showing reduction in battery capacity and open circuit voltage characteristics as a battery is degraded according to an embodiment of the present disclosure.
Figure 3B:
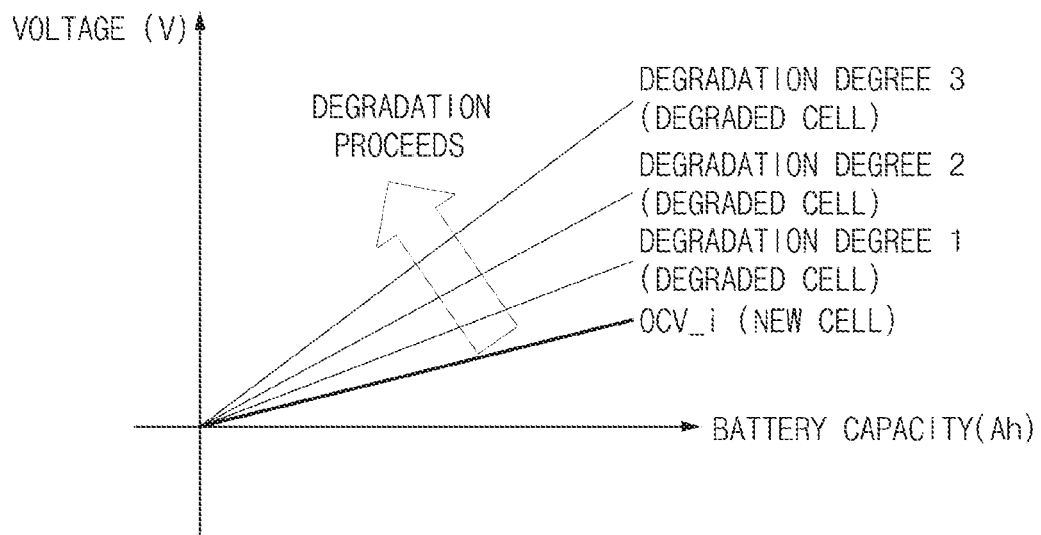
FIG. 3B is a graph showing open circuit voltage characteristics when battery capacity is equally changed according to an embodiment of the present disclosure.

FIG. 3A is a graph showing reduction in battery capacity and open circuit voltage characteristics as a battery is degraded according to an embodiment of the present disclosure. FIG. 3B is a graph showing open circuit voltage characteristics when battery capacity is equally changed according to an embodiment of the present disclosure.

Referring to FIGS. 3A and 3B, a method of calculating a battery degradation degree is based on a change rate of an open circuit voltage according to a battery capacity change amount. As shown in FIGS. 3A and 3B, when start points are the same, an open circuit voltage OCV is definitely changed after battery capacity is changed and, accordingly, whether correction coefficient matching is satisfied may be determined by determining whether an open circuit voltage OCV is within a predetermined range ΔAh in an initial start condition.

Figure 4:
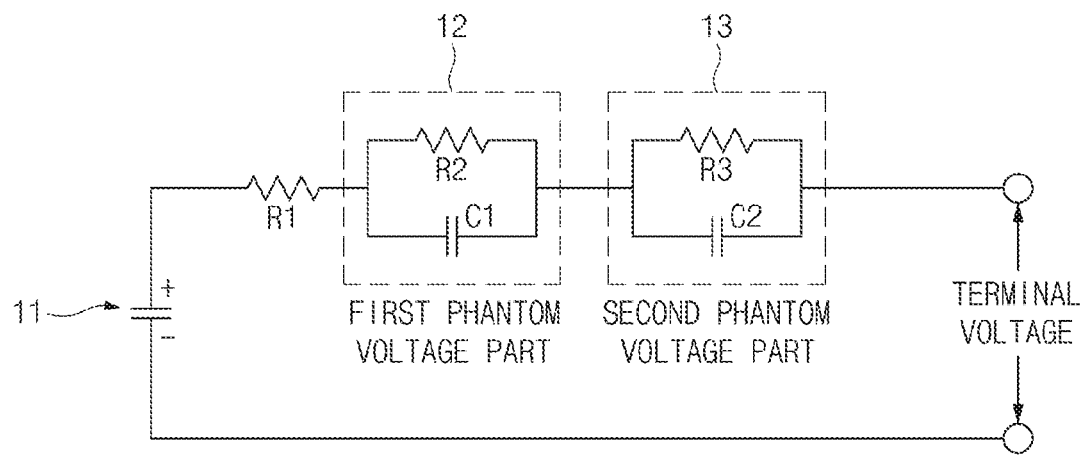
FIG. 4 illustrates a battery equivalent model according to an embodiment of the present disclosure.

The first open circuit voltage calculation unit 130 may calculate the first open circuit voltage OCV using the measured battery state information and a battery equivalent model. The first open circuit voltage calculation unit 130 may measure a terminal voltage of the equivalent model and subtract a voltage across an internal resistor and phantom voltage components from the measured terminal voltage to calculate the first open circuit voltage OCV. In this case, the open circuit voltage is a voltage in a stable state in which any current does not flow and is a value measured when constant current is applied to a high-voltage battery. FIG. 4 illustrates a battery equivalent model according to an embodiment of the present disclosure. The battery equivalent model may be configured in such a way that a power supply 11, an internal resistor R1, a first phantom voltage part 12, and a second phantom voltage part 13 are connected in series, the first phantom voltage part 12 may be configured in such a way that a resistor R2 and a capacitor C1 are connected in parallel, and the second phantom voltage part 13 may be configured in such a way that a resistor R3 and a capacitor C2 are connected in parallel. Referring to FIG. 4, the first open circuit voltage calculation unit 130 may measure a terminal voltage across opposite ends of the equivalent model and, then, subtract a voltage across the internal resistor R1 and phantom voltage components 12 and 13 from the terminal voltage to calculate the first open circuit voltage OCV.

Figure 5:
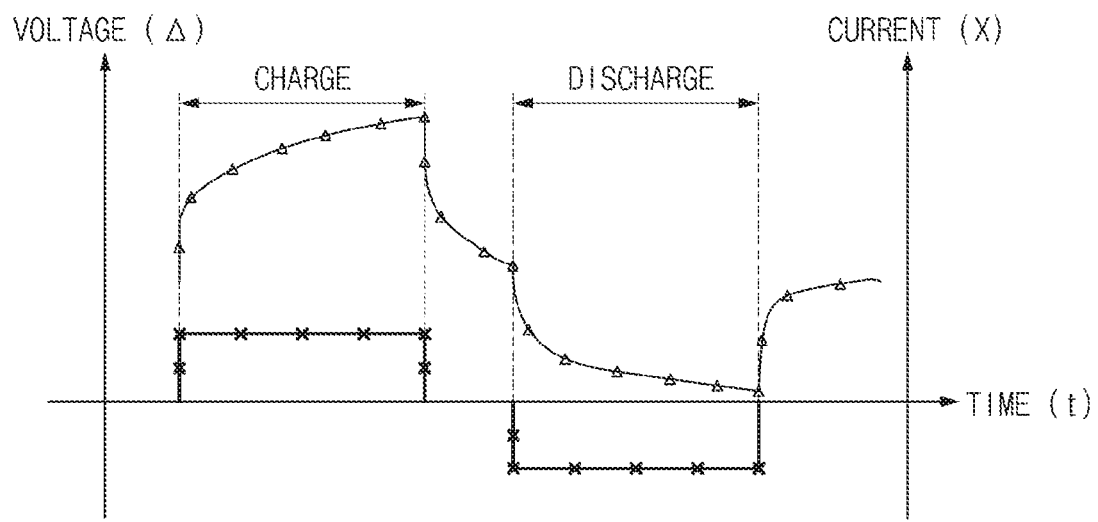
FIG. 5 is a graph showing a terminal voltage when constant current is applied to a battery according to an embodiment of the present disclosure.
Figure 6:
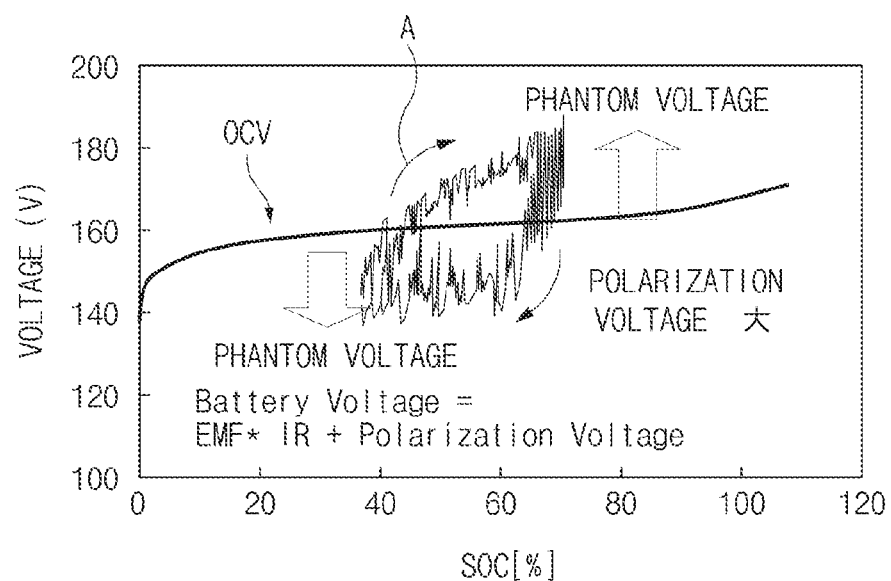
FIG. 6 is a graph showing a relationship between an open circuit voltage and a phantom voltage according to an embodiment of the present disclosure.

In this case, FIG. 5 is a graph showing a terminal voltage when constant current is applied to a battery according to an embodiment of the present disclosure. FIG. 6 is a graph showing a relationship between an open circuit voltage OCV and a phantom voltage according to an embodiment of the present disclosure.

Referring to FIG. 5, constant current is applied during battery charging, a voltage is increased during charging and then reduced after charging, and a voltage is reduced during discharging and then increased after discharging. This is a procedure in which a voltage converges to an open circuit voltage in a normal state and a voltage change amount during the procedure is referred to as a phantom voltage.

Referring to FIG. 6, a clean terminal voltage is not applied during actual vehicle driving, differently from FIG. 5, and a phantom voltage is distributed as shown in FIG. 6. Accordingly, a phantom voltage component may be removed from the terminal voltage component to calculate an open circuit voltage.

As such, a method of calculating an open circuit voltage by subtracting a phantom voltage and a voltage component across an internal resistor from an average voltage (terminal voltage) measured for a predetermined time in the equivalent model to calculate an open circuit voltage is merely an example and, thus, various general methods of calculating an open circuit voltage may be applied to calculate the first open circuit voltage OCV according to the present disclosure.

The integration unit 140 may calculate a change amount of a battery state of charge (SoC) by integrating current of a battery. That is, the battery SOC corresponds to battery capacity per hour and, thus, battery capacity per hour may be obtained by integrating current, that is, by calculating a current movement amount for a predetermined time.

The second open circuit voltage calculation unit 150 may calculate the second open circuit voltage OCV_i corresponding to a change amount of a battery SoC using a mapping table. In this case, the mapping table may be formed by mapping the open circuit voltage and the battery SoC.

The second open circuit voltage calculation unit 150 may search for an open circuit voltage corresponding to a change amount of the battery SoC calculated by the integration unit 140 in the mapping table and calculate the open circuit voltage corresponding to the change amount of the battery SoC as the second open circuit voltage OCV_i.

The correction coefficient calculation unit 160 may calculate a correction coefficient X using a difference value between the first open circuit voltage OCV and the second open circuit voltage OCV_i according to Equation 1 below.

$$X = Kp*(OCV - OCVi) \quad \text{Equation 1}$$

Kp is a correction constant and is a value for determining a convergence rate to a deviation of an open circuit voltage. In this regard, when a high convergence rate is needed, the correction constant needs to be determined as a high value and, when a low convergence rate is needed, the correction constant needs to be determined as a small value. X is a correction coefficient. That is, the correction coefficient may be calculated by multiplying a difference value between the first open circuit voltage OCV and the second open circuit voltage OCV_i by the correction constant.

The degradation degree estimation unit 170 may estimate a battery degradation degree using the correction coefficient.

$$Y = aX + b \quad \text{Equation 2}$$

Y is a battery degradation degree, X is a correction coefficient, and a and b are degradation degree constants.

Figure 7:
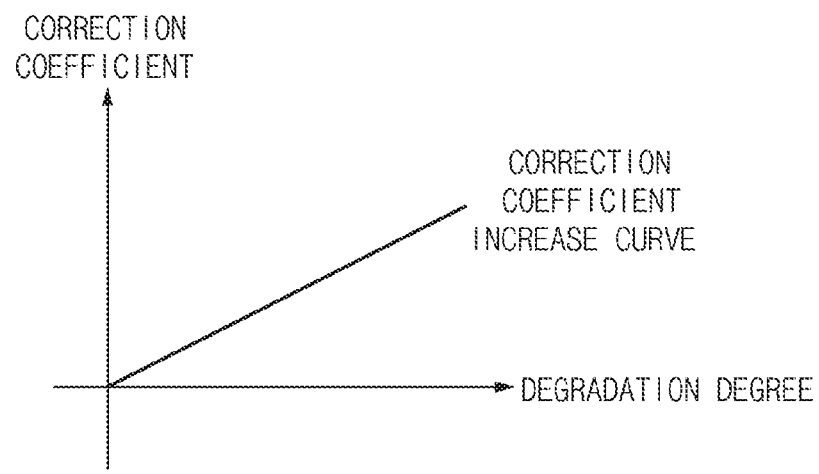
FIG. 7 is a graph showing characteristics of change in correction coefficient in response to battery degradation according to an embodiment of the present disclosure.

FIG. 7 is a graph showing characteristics of change in correction coefficient in response to battery degradation according to an embodiment of the present disclosure. As seen from FIG. 7, the battery degradation degree is increased in proportion to a correction coefficient.

The memory device 200 may store the first open circuit voltage OCV, the second open circuit voltage OCV_i, the mapping table, the calculated correction coefficient, an estimation state of a degradation degree, and so on.

The display device 300 may display the estimated battery degradation state and a driving distance according to the estimated degradation degree.

Figure 8:
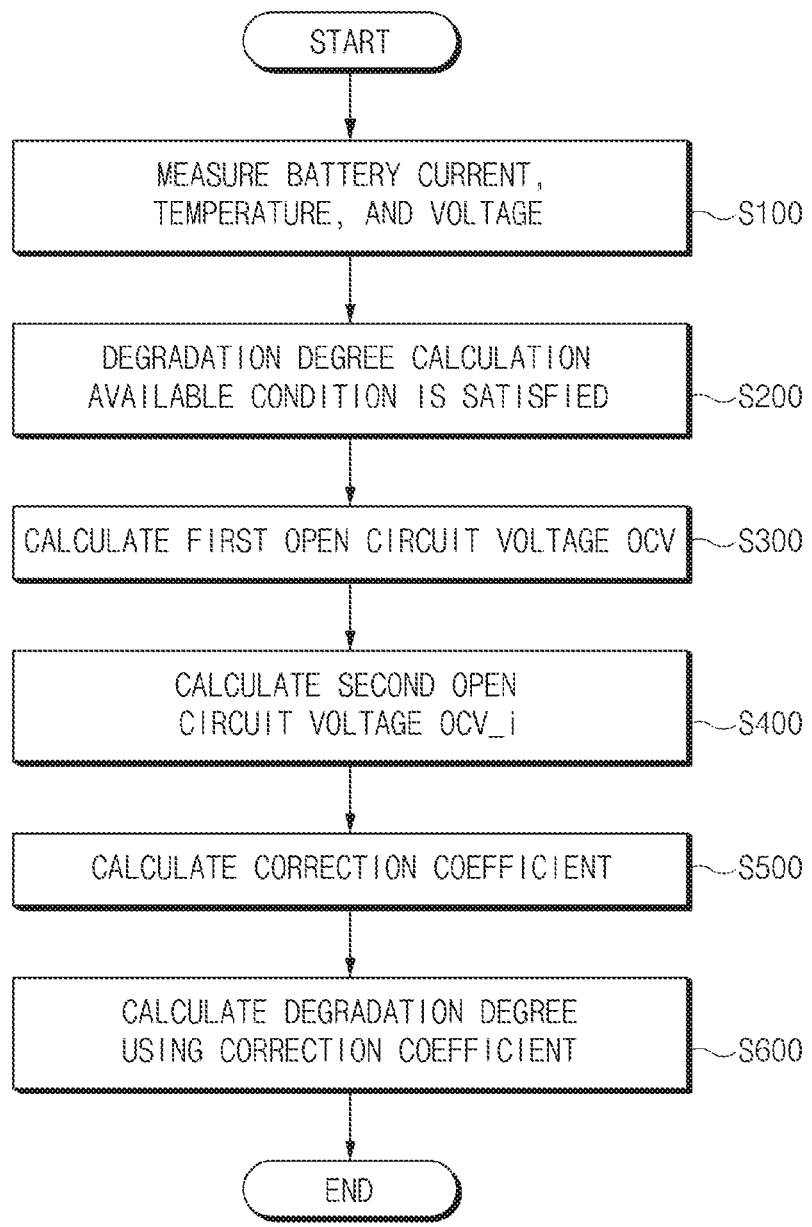
FIG. 8 is a flowchart of a method of estimating a battery degradation state according to an embodiment of the present disclosure.

Hereinafter, a method of estimating a battery degradation state according to an embodiment of the present disclosure will be described in detail with reference to FIG. 8.

In operation 5100, the battery degradation state estimation apparatus 100 may measure battery current, voltage, and temperature of a vehicle.

Then, in operation 5200, the battery degradation state estimation apparatus 100 may determine whether a degradation degree calculation available condition is satisfied. In this case, the battery degradation degree calculation available condition may be determined by determining whether the open circuit voltage calculating condition is satisfied, whether correction coefficient matching is satisfied, and so on.

The open circuit voltage calculating condition may include all conditions for open circuit voltage calculation through the equivalent model shown in FIG. 4. In addition, whether correction coefficient matching is satisfied may be determined by determining whether an open circuit voltage is present within a predetermined range in an initial start condition. That is, as seen from FIGS. 3A and 3B, if start points are the same, an open circuit voltage is remarkably changed after battery capacity is changed.

When the degradation degree calculation available condition is satisfied in operation 5200, in operation 5300, the battery degradation state estimation apparatus 100 may calculate the first open circuit voltage OCV, which is a reference voltage, using the measured current, voltage, and temperature of a vehicle battery In this case, a voltage across the internal resistor R1 of the battery and the phantom voltage components 12 and 13 may be subtracted from the terminal voltage across opposite ends to calculate the first open circuit voltage OCV in the battery equivalent model shown in FIG. 4.

In operation 5400, the battery degradation state estimation apparatus 100 may calculate the second open circuit voltage OCV_i corresponding to a change amount of a SoC, which is determined through current integration, for the same time. That is, a mapping table for storing an open circuit voltage mapped for each battery SoC may be pre-prepared and an open circuit voltage corresponding to a change amount of a battery SoC in response to a change amount of current integration may be calculated as the second open circuit voltage OCV_i.

In operation 5500, the battery degradation state estimation apparatus 100 may multiply a difference value between the first open circuit voltage OCV calculated from measured data and the second open circuit voltage OCV_i determined through current integration by a correction constant to calculate the correction coefficient 'X'.

In operation 5600, the battery degradation state estimation apparatus 100 may determine whether correction coefficient matching is satisfied and determine a degradation degree using the correction coefficient.

As such, the battery degradation state estimation apparatus 100 according to the present disclosure may calculate the first open circuit voltage OCV using the measured battery state information (current, voltage, and temperature), calculate the second open circuit voltage corresponding to a battery SoC determined through current integration from the mapping table, and estimate a battery degradation state using the difference value between the first open circuit voltage OCV and the second open circuit voltage as the correction coefficient so as to estimate a battery degradation state of a hybrid vehicle, which is not necessarily charged, even not in a constant current condition.

Figure 9:
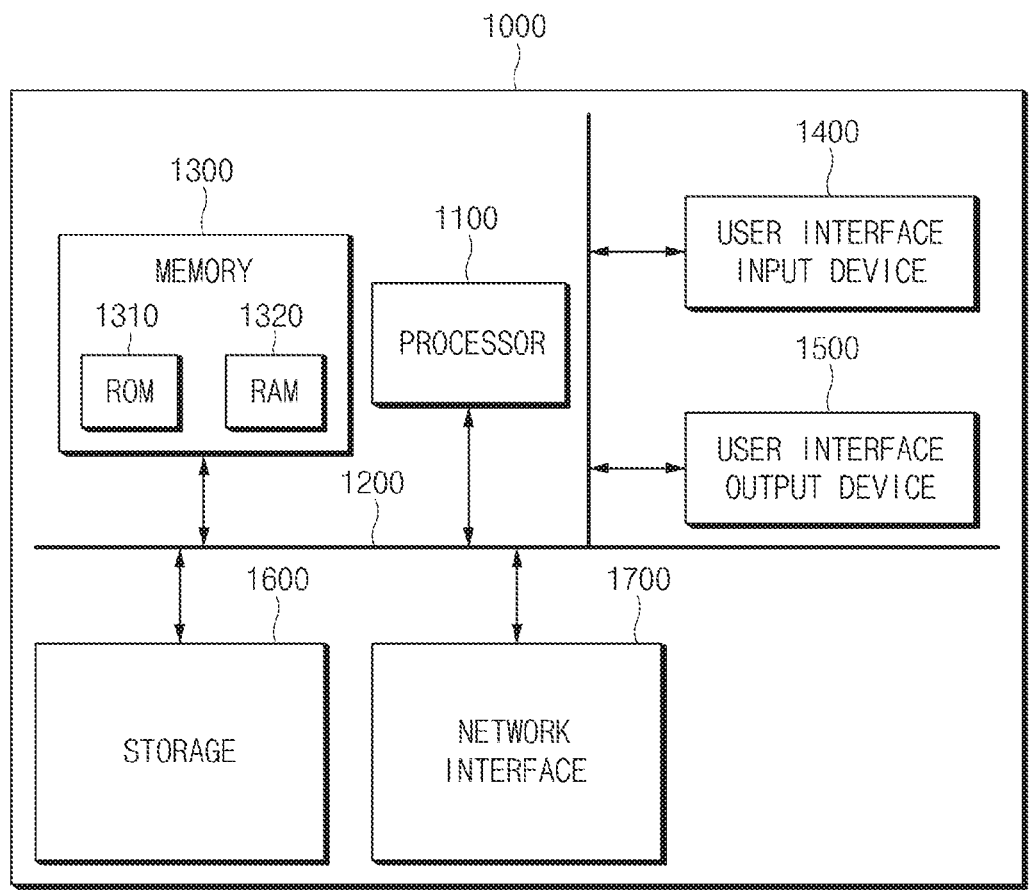
FIG. 9 is a block diagram illustrating a configuration of a computing system to which a method of estimating a battery degradation state is applied, according to an exemplary embodiment of the present disclosure.

FIG. 9 is a block diagram illustrating a configuration of a computing system 1000 to which a method of estimating a battery degradation state is applied, according to an exemplary embodiment of the present disclosure.

Referring to FIG. 9, the computing system 1000 may include at least one processor 1100, a memory 1300, a user interface input device 1400, a user interface output device 1500, a storage 1600, and a network interface 1700, which are connected with each other via a bus 1200.

The processor 1100 may be a central processing unit (CPU) or a semiconductor device for processing instructions stored in the memory 1300 and/or the storage 1600. Each of the memory 1300 and the storage 1600 may include various types of volatile or non-volatile storage media. For example, the memory 1300 may include a read only memory (ROM) and a random access memory (RAM).

Thus, the operations of the methods or algorithms described in connection with the embodiments disclosed in the specification may be directly implemented with a hardware module, a software module, or combinations thereof, executed by the processor 1100. The software module may reside on a storage medium (i.e., the memory 1300 and/or the storage 1600), such as a RAM, a flash memory, a ROM, an erasable and programmable ROM (EPROM), an electrically EPROM (EEPROM), a register, a hard disc, a removable disc, or a compact disc-ROM (CD-ROM).

The storage medium may be coupled to the processor 1100. The processor 1100 may read out information from the storage medium and may write information in the storage medium. Alternatively, the storage medium may be integrated with the processor 1100. The integrated processor and storage medium may reside in an application specific integrated circuit (ASIC). The ASIC may reside in a user terminal. Alternatively, the integrated processor and storage medium may reside as a separate component of the user terminal.

According to the present disclosure, a high-voltage battery degradation degree of a vehicle may be estimated irrespective of a vehicle type even not in a constant current condition.

According to the present disclosure, a battery degradation degree may be estimated in real time even in a vehicle driving state.

In addition, according to the present disclosure, a battery degradation degree may be predicted in real time and an available driving distance and so on may be accurately predicted and provided based on the battery degradation degree, thereby enabling safe driving.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

Therefore, embodiments of the present disclosure are not intended to limit the technical spirit of the present disclosure, but provided only for the illustrative purpose. The scope of protection of the present disclosure should be construed by the attached claims, and all equivalents thereof should be construed as being included within the scope of the present disclosure.

What is claimed is:

1. A system for estimating a battery degradation state, the system comprising:
   a processor configured to estimate a battery degradation state by using a correction coefficient calculated from a difference between a first open circuit voltage (OCV), calculated from battery state information, and a second open circuit voltage (OCV_i), acquired based on a change amount of a battery state of charge (SoC) determined by current integration; and
   a memory device configured to store the first open circuit voltage, the second open circuit voltage, and the correction coefficient,
   wherein the processor is further configured to measure a terminal voltage of a battery equivalent model and subtract a voltage across an internal resistor and a phantom voltage component from the measured terminal voltage to calculate the first open circuit voltage.

2. The system of claim 1, wherein the battery state information includes:
   voltage, temperature, and current.

3. The system of claim 2, wherein the processor is further configured to:
   calculate the first open circuit voltage by using the battery state information and the battery equivalent model;
   calculate a change amount of a battery state of charge (SoC) by integrating current of a battery;
   calculate the second open circuit voltage corresponding to the change amount of the battery SoC by using a mapping table;
   calculate the correction coefficient by using a difference between the first open circuit voltage and the second open circuit voltage; and
   estimate a battery degradation degree by using the correction coefficient.

4. The system of claim 3, wherein the processor is further configured to measure the battery state information.

5. The system of claim 3, wherein the processor is further configured to calculate an open circuit voltage mapped to the change amount of the battery SoC and determine the calculated open circuit voltage as the second open circuit voltage by using the mapping table configured to map the open circuit voltage and the battery SoC.

6. The system of claim 3, wherein the processor is further configured to determine an open circuit voltage calculating condition and perform correction coefficient matching for calculation of the first open circuit voltage and the second open circuit voltage.

7. The system of claim 6, wherein the processor is further configured to determine whether the open circuit voltage calculating condition is satisfied according to current and voltage distribution degrees of the battery.

8. The system of claim 7, wherein the processor is configured to assume an initial voltage measured when a vehicle starts as an open circuit voltage and calculate the battery SoC depending on the assumed open circuit voltage, and
   wherein, when a deviation between a current battery SoC and the battery SoC calculated based on the initial voltage exceeds a predetermined range, the processor is configured to determine that the correction coefficient matching is not satisfied.

9. The system of claim 1, further comprising:
   a display device configured to display a driving distance according to the estimated battery degradation state and the estimated degradation degree.

10. A battery degradation state estimation apparatus comprising a processor configured to:

measure battery state information;
calculate a first open circuit voltage by using the measured battery state information and a battery equivalent model;
calculate a change amount of a battery state of charge (SoC) by integrating current of a battery;
calculate a second open circuit voltage corresponding to the change amount of the battery state of charge (SoC);
calculate a correction coefficient by using a difference of the first open circuit voltage and the second open circuit voltage; and
estimate a battery degradation degree by using the correction coefficient,
wherein the processor is further configured to measure a terminal voltage of the battery equivalent model and subtract a voltage across an internal resistor and a phantom voltage component from the measured terminal voltage to calculate the first open circuit voltage.

11. The apparatus of claim 10, wherein the processor is further configured to calculate an open circuit voltage mapped to the change amount of the battery SoC and determine the calculated open circuit voltage as the second open circuit voltage by using a mapping table configured to map the open circuit voltage and the battery SoC.

12. The apparatus of claim 10, wherein the processor is further configured to:
determine an open circuit voltage calculating condition and perform correction coefficient matching for calculation of the first open circuit voltage and the second open circuit voltage.

13. The apparatus of claim 12, wherein the processor is further configured to calculate the first open circuit voltage and the second open circuit voltage when the open circuit voltage calculating condition and the correction coefficient matching are satisfied.

14. A method of estimating a battery degradation state, the method comprising:

measuring, by a processor, battery state information;
calculating, by the processor, a first open circuit voltage using the measured battery state information and a battery equivalent model;
calculating, by the processor, a change amount of a battery state of charge (SoC) by integrating current of a battery;
calculating, by the processor, a second open circuit voltage corresponding to the change amount of the battery SoC by using a mapping table;
calculating, by the processor, a correction coefficient by using a difference between the first open circuit voltage and the second open circuit voltage; and
estimating, by the processor, a battery degradation degree by using the correction coefficient,
wherein the calculating of a first open circuit voltage includes:
measuring a terminal voltage of the battery equivalent model and subtracting a voltage across an internal resistor and a phantom voltage component from the measured terminal voltage to calculate the first open circuit voltage.

15. The method of claim 14, further comprising,
prior to the calculating of a first open circuit voltage, determining an open circuit voltage calculating condition and performing correction coefficient matching for calculation of the first open circuit voltage and the second open circuit voltage.

16. The method of claim 14, wherein the calculating of a second open circuit voltage includes:
calculating an open circuit voltage mapped to the change amount of the battery SoC and determining the calculated open circuit voltage as the second open circuit voltage by using the mapping table configured to map the open circuit voltage and the battery SoC.

* * * * *